United States Patent
Wang et al.

(10) Patent No.: US 7,673,270 B1
(45) Date of Patent: Mar. 2, 2010

(54) METHOD AND APPARATUS FOR COMPENSATING AN INTEGRATED CIRCUIT LAYOUT FOR MECHANICAL STRESS EFFECTS

(75) Inventors: Yan Wang, Campbell, CA (US); Nui Chong, Cupertino, CA (US); Hong-Tsz Pan, Cupertino, CA (US); Bang-Thu Nguyen, Santa Clara, CA (US); Jonathan Jung-Ching Ho, Fremont, CA (US); Qi Lin, Cupertino, CA (US); Yuhao Luo, San Jose, CA (US); Hing Yee Angela Wong, San Jose, CA (US); Xin X. Wu, Fremont, CA (US); Yuezhen Fan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 244 days.

(21) Appl. No.: 11/717,811

(22) Filed: Mar. 13, 2007

(51) Int. Cl.
*G06F 17/50* (2006.01)

(52) U.S. Cl. .............................. 716/12; 716/1; 716/11

(58) Field of Classification Search ............... 716/1, 716/11, 12
See application file for complete search history.

(56) References Cited

U.S. PATENT DOCUMENTS

| 7,032,194 B1 * | 4/2006 | Hsueh et al. .................. 716/4 |
| 2004/0238820 A1 * | 12/2004 | Sakama et al. ................ 257/59 |

* cited by examiner

*Primary Examiner*—Thuan Do
(74) *Attorney, Agent, or Firm*—Robert M. Brush

(57) ABSTRACT

Method and apparatus for compensating an integrated circuit design for mechanical stress effects. One aspect of the invention relates to designing an integrated circuit. Layout data is obtained that describes layers of the integrated circuit. At least one of the layers is analyzed to detect at least one structure susceptible to damage from mechanical stress. A bias is automatically added to each of the at least one structure to reduce mechanical stress of the at least one structure as fabricated. Augmented layout data is then provided for the integrated circuit.

19 Claims, 8 Drawing Sheets

1200

US 7,673,270 B1

METHOD AND APPARATUS FOR COMPENSATING AN INTEGRATED CIRCUIT LAYOUT FOR MECHANICAL STRESS EFFECTS

FIELD OF THE INVENTION

One or more aspects of the invention relate to integrated circuit design systems and, more particularly, to a method and apparatus for compensating an integrated circuit layout for mechanical stress effects.

BACKGROUND

The scaling of integrated circuits is a constant effort. With circuits becoming smaller and faster, device current becomes more important. Device current is closely related to transistor gate length, transistor gate capacitance, and carrier mobility. Notably, increasing carrier mobility can improve the device current performance. One technique known to increase carrier mobility is the formation of a stressed silicon channel. Placing silicon under stress can enhance bulk electron and hole mobility.

Stress can be applied to transistor channel regions by forming a stress-inducing contact etch stop layer (CESL) over the transistors. When such a CESL is deposited, due to the lattice spacing mismatch between the CESL and the underlying layer, a stress develops to match the lattice spacing. The stress can have components parallel to the transistor channels and parallel to the transistor width direction. Research has revealed that a CESL that induces a tensile stress field in the channel length direction can improve performance in n-type metal oxide semiconductor (nMOS) transistors, and compressive stress can improve performance in p-type MOS (pMOS) transistors.

High intrinsic stress films commonly used to enhance carrier mobility, such as a CESL, have been found to cause cracks in polysilicon ("poly") lines forming transistor gates due to mechanical stress. The polysilicon formations are particularly susceptible to cracking in proximity of line junctions, such as T-shaped junctions. Such cracks in the polysilicon formations may increase polysilicon resistance or otherwise deleteriously affect circuit functionality. Accordingly, there exists a need in the art for a method and apparatus that compensates an integrated circuit design for mechanical stress effects, such as those induced by mobility stress engineering.

SUMMARY

Method and apparatus for compensating an integrated circuit design for mechanical stress effects are described. One aspect of the invention relates to designing an integrated circuit. Layout data is obtained that describes layers of the integrated circuit. At least one of the layers is analyzed to detect at least one structure susceptible to damage from mechanical stress. A bias is automatically added to each of the at least one structure to reduce the mechanical stress of the at least one structure as fabricated. Augmented layout data is then provided for the integrated circuit.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

Method and apparatus for compensating an integrated circuit (IC) layout for mechanical stress effects are described. Such mechanical stress effects can include, for example, damage to polysilicon ("poly") and/or metal lines that results from mechanical stress on one or more layers of the IC. Aspects of the invention are discussed with respect to mechanical stress caused by the deposition of a high intrinsic stress film for the purpose of increasing carrier mobility in the underlying silicon. In one embodiment, an IC design system includes a stress compensation module for processing IC layout data to compensate for mechanical stress effects. The stress compensation module analyzes the IC layout to detect structures or patterns of lines susceptible to damage from mechanical stress. The stress compensation module automatically provides a bias to the detected structures or patterns to increase the mechanical strength of the affected lines. The stress compensation module may process the IC layout at various stages in the design process, such as before optical proximity correction (OPC) during layout or during layout verification, or during OPC.

Figure 1:
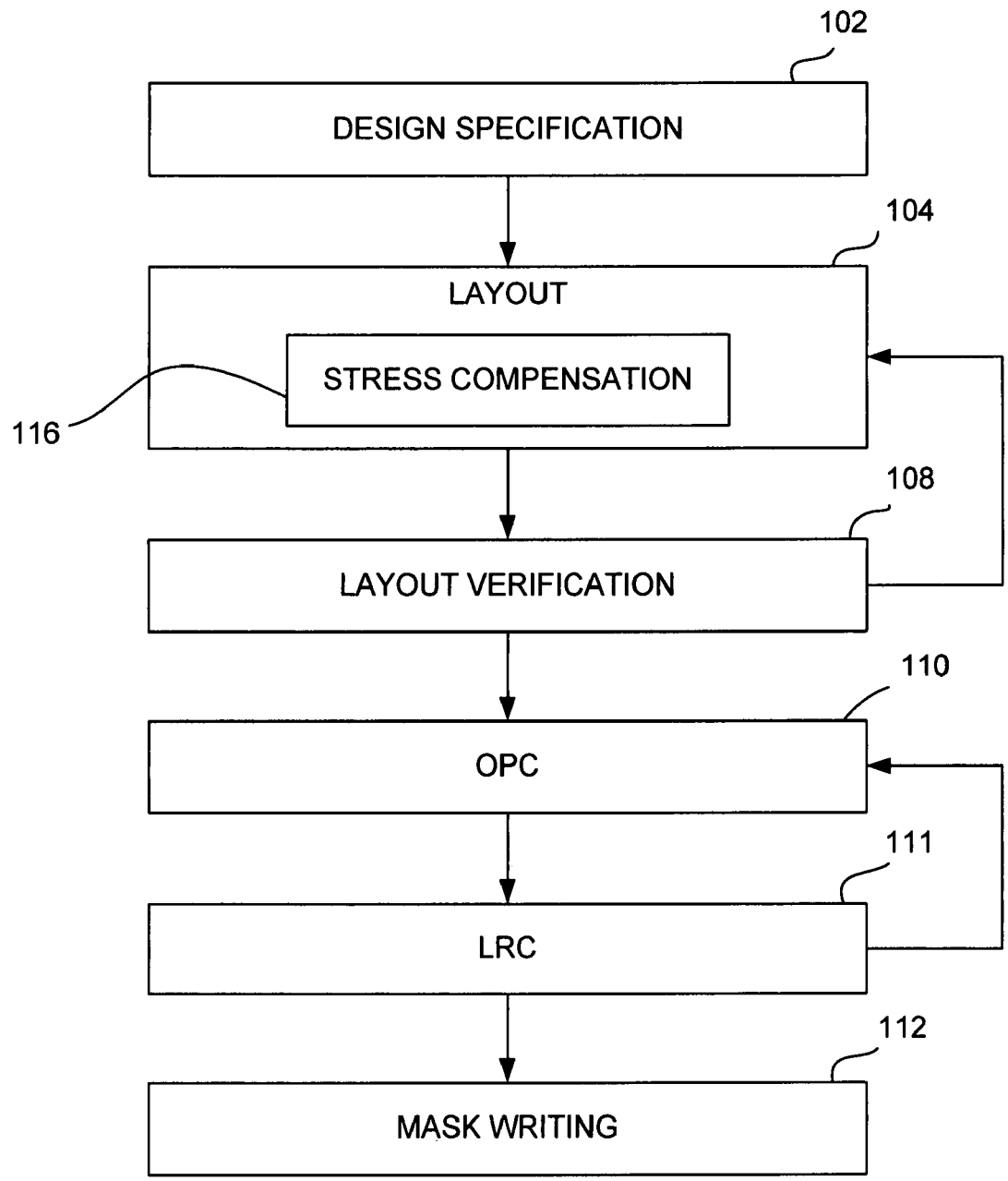
FIG. 1 is a block diagram depicting an exemplary embodiment of an IC design system in accordance with one or more aspects of the invention.

FIG. 1 is a block diagram depicting an exemplary embodiment of an IC design system 100 in accordance with one or more aspects of the invention. The system 100 includes a design specification module 102, a layout module 104, a layout verification module 108, an optical proximity correction (OPC) module 110, a lithography rule check (LRC) module 111, and a mask writing module 112. The design specification module 102 is configured to establish a set of specifications of an integrated circuit design and produce a transistor-level and/or gate-level description of the design. The specifications typically describe the expected functionality of the design and may define values for various parameters, such as maximum allowable delay times, setup and hold time, operation frequency, operation conditions, silicon area constraints, power dissipation constraints, and the like. For example, the design specification module 102 may provide a schematic editor or other type of editor that allows a designer to draw, place, and connect individual circuit components to generate the transistor-level and/or gate-level description, referred to as a netlist.

The layout module 104 generates layout data for the design in response to the netlist. The layout data describes geometries and relative positioning of mask layers (layers) to be used in actual fabrication of the integrated circuit. The layout data also includes cells, which define sets of particular devices within the integrated circuit. Cells typically contain all the polygons on all the layers required for the fabrication of the respective devices. Cells can be nested within other cells, often in very intricate arrangements. The structure of cells provides a hierarchy. Typical formats for the polygons of the layout data are GDS II (Graphic Design System II) or CIF (Caltech Intermediate Format), for example.

The layout verification module 108 is configured to process the layout data from the layout module 104. Once the layout module 104 creates a layout, the layout verification module 108 verifies the layout. Verification includes ensuring that the transformation from netlist to layout has been properly executed and that the layout created adheres to certain geometric design rules. Such layout verification operations are often referred to as layout versus schematic (LVS) and design rule check (DRC) operations. If the layout verification module 108 detects errors in the layout data, the layout module 104 may be invoked to modify the layout data to correct the errors. In some cases, the errors are such that the design specification module 102 must be invoked to modify the design.

The OPC module 110 is also configured to further process the layout data. The OPC module 110 compensates the layout data for non-ideal properties of the lithography process. OPC algorithms are well-known in the art. After processing by the OPC module 110, the LRC module 111 checks the layout data to ensure that the layout data is free of errors. If the LRC module 111 detects errors in the OPC corrected layout data, the OPC module 110 may be invoked to correct the errors. The mask writing module 112 is configured to process the layout data after OPC. The mask writing module 112 generates a description of the layout data on masks for manufacturing of the integrated circuits.

Figure 2:
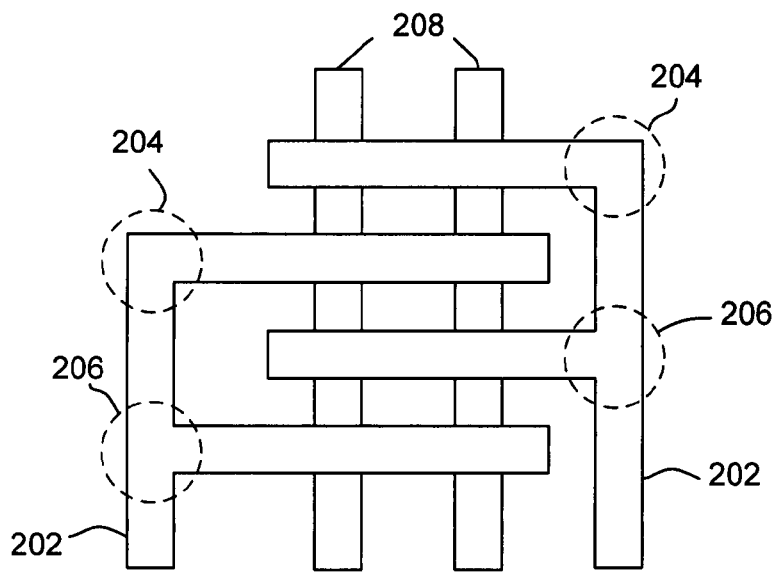
FIG. 2 is a block diagram depicting an exemplary structure in a layer of the layout of an integrated circuit.

As discussed above, the fabrication process for an integrated circuit may include the deposition of a high intrinsic stress film over one or more layers to enhance carrier mobility. For example, a contact etch stop layer (CESL) may be deposited over a layer, such as the polysilicon layer. FIG. 2 is a block diagram depicting an exemplary structure 200 in a layer of the layout of an integrated circuit. For example, the structure 200 may include part of the polysilicon layer and part of the diffusion region (i.e., the structure 200 forms transistor gates where the polysilicon layer 202 passes over diffusion regions 208). The structure 200 includes lines formed in an exemplary pattern. The exemplary pattern includes regions where lines intersect to produce one or more junctions. In the present example, the polysilicon layer 202 in structure 200 includes L-shaped junctions 204 and T-shaped junctions 206.

Figure 3:
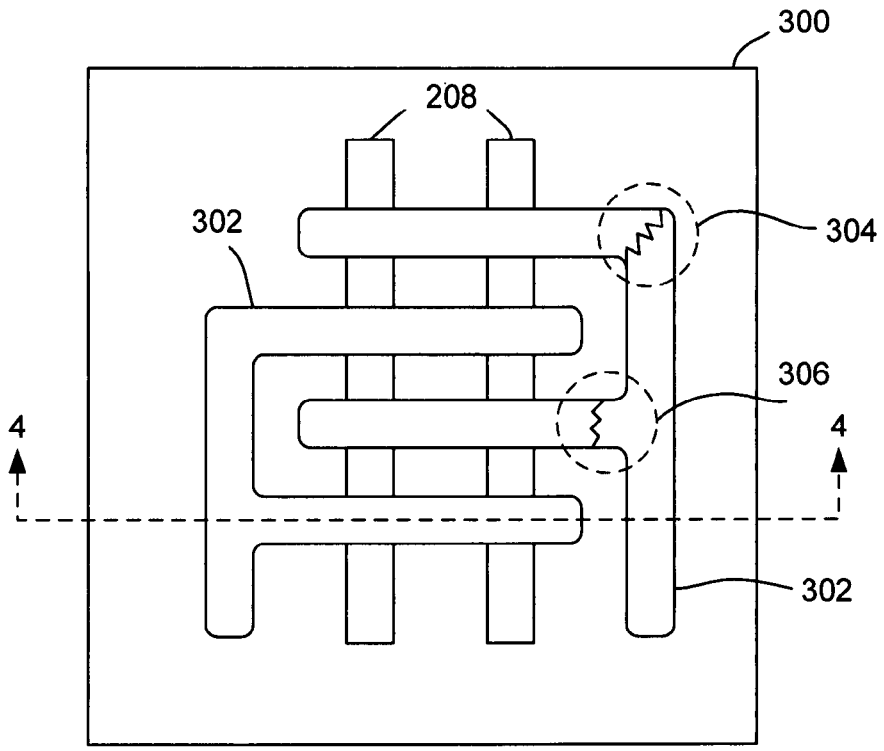
FIG. 3 is a top view of an integrated circuit substrate having a polysilicon layer formed by a mask corresponding to the structure of FIG. 2.

FIG. 3 is a top view of an integrated circuit substrate 300 having a polysilicon layer 302 formed by a mask corresponding to the structure 202. The polysilicon layer 302 is disposed over diffusion regions 208. A CESL (shown in FIG. 4) is deposited over the polysilicon layer 302. As described above, the CESL is used to apply stress in channel region of the substrate 300 for the purpose of increasing carrier mobility. The CESL also exerts a mechanical stress on the polysilicon layer 302. The inventors have found that high intrinsic stress films, such as a CESL, can cause cracks in the polysilicon layer 302 in proximity to line intersections. In the present example, cracks are present at intersection 304 corresponding to L-shaped junction 204 (FIG. 2) and intersection 306 corresponding to T-shaped junction 206 (FIG. 2). In general, the CESL exerts higher mechanical stress proximate line intersections than in other regions.

Figure 4:
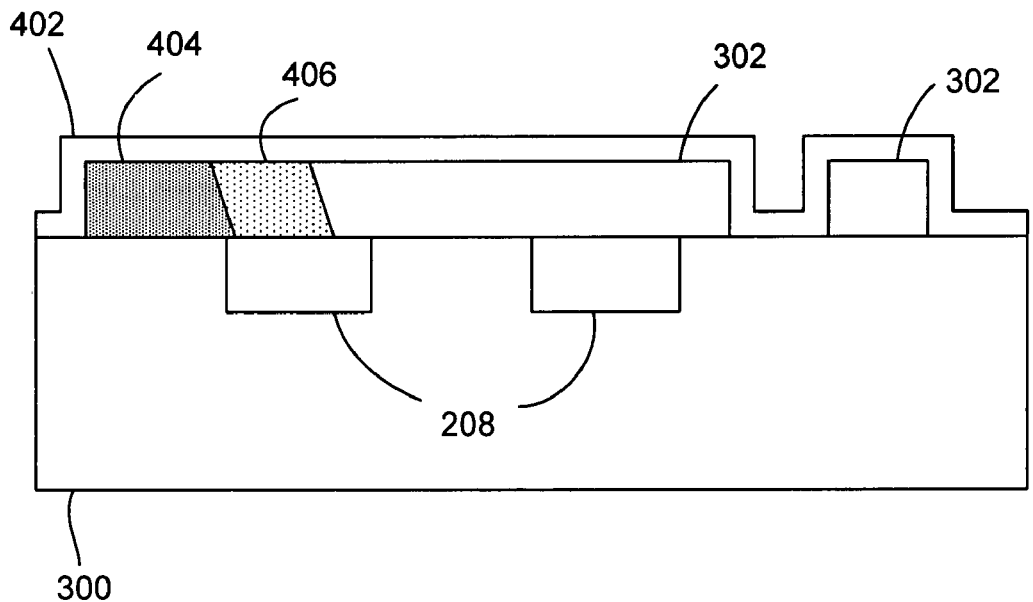
FIG. 4 is a cross sectional view of the substrate of FIG. 3 taken along the line 4-4.

FIG. 4 is a cross sectional view of the substrate 300 of FIG. 3 taken along the line 4-4. A CESL 402 is shown deposited over the polysilicon layer 302. A region 404 of the polysilicon layer 302, which is most proximate a line intersection, exhibits the highest mechanical stress. A region 406 of the polysilicon layer 302 exhibits high mechanical stress, but less than that of the region 404. The remaining portion of the polysilicon layer 302 exhibits less mechanical stress than the regions 404 and 406.

Returning to FIG. 1, in one embodiment, the layout module 104 includes a stress compensation module 116. The stress compensation module 116 is configured to analyze one or more layers in the layout data to detect structures susceptible to damage from mechanical stress. In one embodiment, the stress compensation module 116 identifies line intersections in a layer as structures susceptible to damage from mechanical stress. Such line intersections may include L-shaped line junctions, T-shaped line junctions, and the like. For each identified structure, the stress compensation module 116 automatically provides a bias to increase the mechanical strength of the structure. The bias has the effect of reducing the mechanical stress inside the structure when fabricated. For example, the bias can be provided by increasing the width of a poly line to increase its mechanical strength and resistance to cracking.

In the present example, the stress compensation module 116 processes the layout data prior to layout verification and optical proximity correction. Layout verification and OPC is then performed on the layout data as compensated by the stress compensation module 116. In one embodiment, the stress compensation module 116 automatically provides a bias to a structure by adding at least one polygon at the line junction. For example, the stress compensation module 116 may add polygons to the layout data at the corner(s) of an L-shaped or T-shaped line junction or other type of identified junction.

Figure 5:
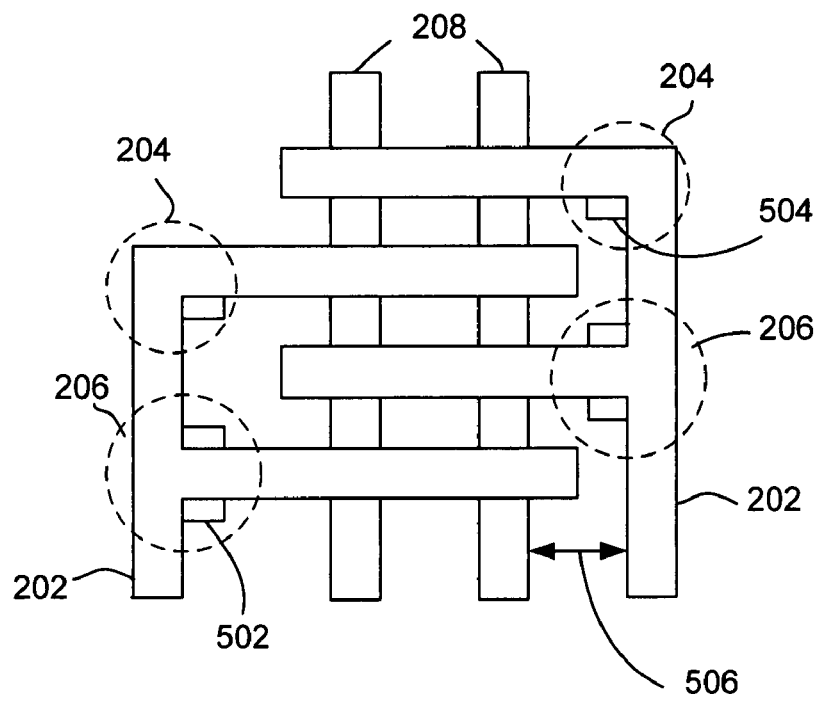
FIG. 5 is a block diagram depicting an exemplary structure in a layer of the layout data after processing by a stress compensation module in accordance with one or more aspects of the invention.

FIG. 5 is a block diagram depicting an exemplary structure 500 in a layer of the layout data after processing by the stress compensation module 116. The structure 500 is an augmentation of the structure 200 of FIG. 2. Polygons 504 were automatically added to the corner of each L-shaped junction 204 (FIG. 2), and polygons 502 were added to the corners of each T-shaped junction 206 (FIG. 2). In the present example, the polygons comprise rectangles. Those skilled in the art will appreciate that other types of polygons may be employed, such as wedges, squares, and the like.

The size of the added polygons, and hence the amount of bias, can be controlled for different structures. The size of the polygons may depend on factors such as the width of the lines, the space between a polysilicon line and a diffusion area, the amount of increase in mechanical strength desired, and various other design rules. For example, the diffusion areas 208 are shown with poly/diffusion spaces 506. The width of the polygons 502 and 504 may be determined based on the width of the polysilicon lines 202, and the length of the polygons 502 and 504 may be determined based on the poly/diffusion spaces 506. For example, if the width of the lines 202 is on the order of 65 nm, then the width of the polygons 502 and 504 may be approximately 30 nm. For larger poly/diffusion spaces 506, the length of the polygons 502 and 504 may be approximately 100 nm. For smaller poly/diffusion spaces 506, the length of the polygons 502 and 504 may be approximately 50 nm. Those skilled in the art will appreciate that these dimensions are merely exemplary and that the polygons 502 and 504 may have other dimensions, which may be dictated by various design rules.

Figure 6:
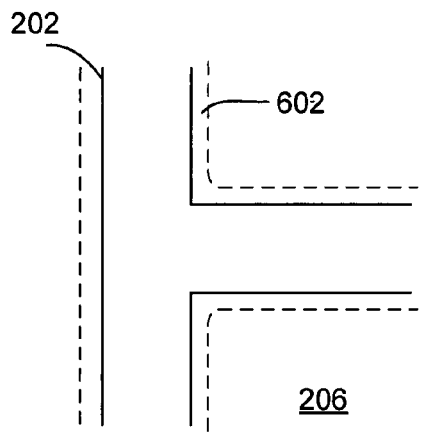
FIG. 6 is a block diagram depicting a possible poly contour of a T-shaped junction of the structure of FIG. 2.
Figure 7:
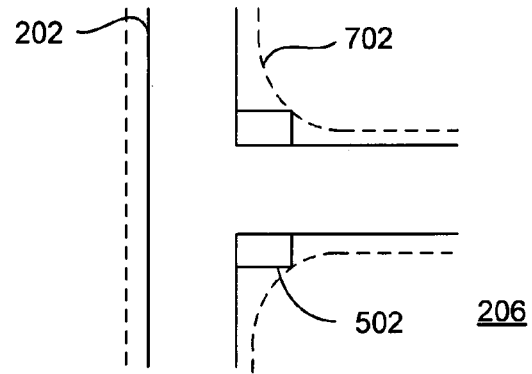
FIG. 7 is a block diagram depicting a possible poly contour of a T-shaped junction of the structure of FIG. 5.

FIG. 6 is a block diagram depicting a possible polysilicon contour of a T-shaped junction 206 of the structure 200. An outline 602 shows a simulation of how the T-shaped junction 206 will be formed during fabrication. The outline 602 shows the rounding of the corners of the T-shaped junction 206 due to the non-ideal properties of the lithography process. FIG. 7 is a block diagram depicting a possible polysilicon contour of a T-shaped junction 206 of the structure 500. As shown in FIG. 5, the structure 500 includes polygons 502 at the corners of the T-shaped junction 206. An outline 702 shows a simulation of how the T-shaped junction 206 will be formed during fabrication. Due to the polygons 502, the physical width of the polysilicon 206 at the intersection of the T-shaped junction 206 is increased, as shown by the outline 702 compared to the outline 602. Although a T-shaped junction has been shown as an example, the simulations are similar for line intersections of other types (e.g., L-shaped junctions).

Returning to FIG. 1, the stress compensation module 116 is shown as part of the layout module 104. Those skilled in the art will appreciate that the stress compensation module 116 may be a stand-alone module having access to the layout data produced by the layout module 104. In addition, although the polysilicon layer has been described in the above examples, those skilled in the art will appreciate that the stress compensation module 116 may process other layers of the layout data that are susceptible to damage from mechanical stress, in addition to or instead of the polysilicon layer.

Figure 8:
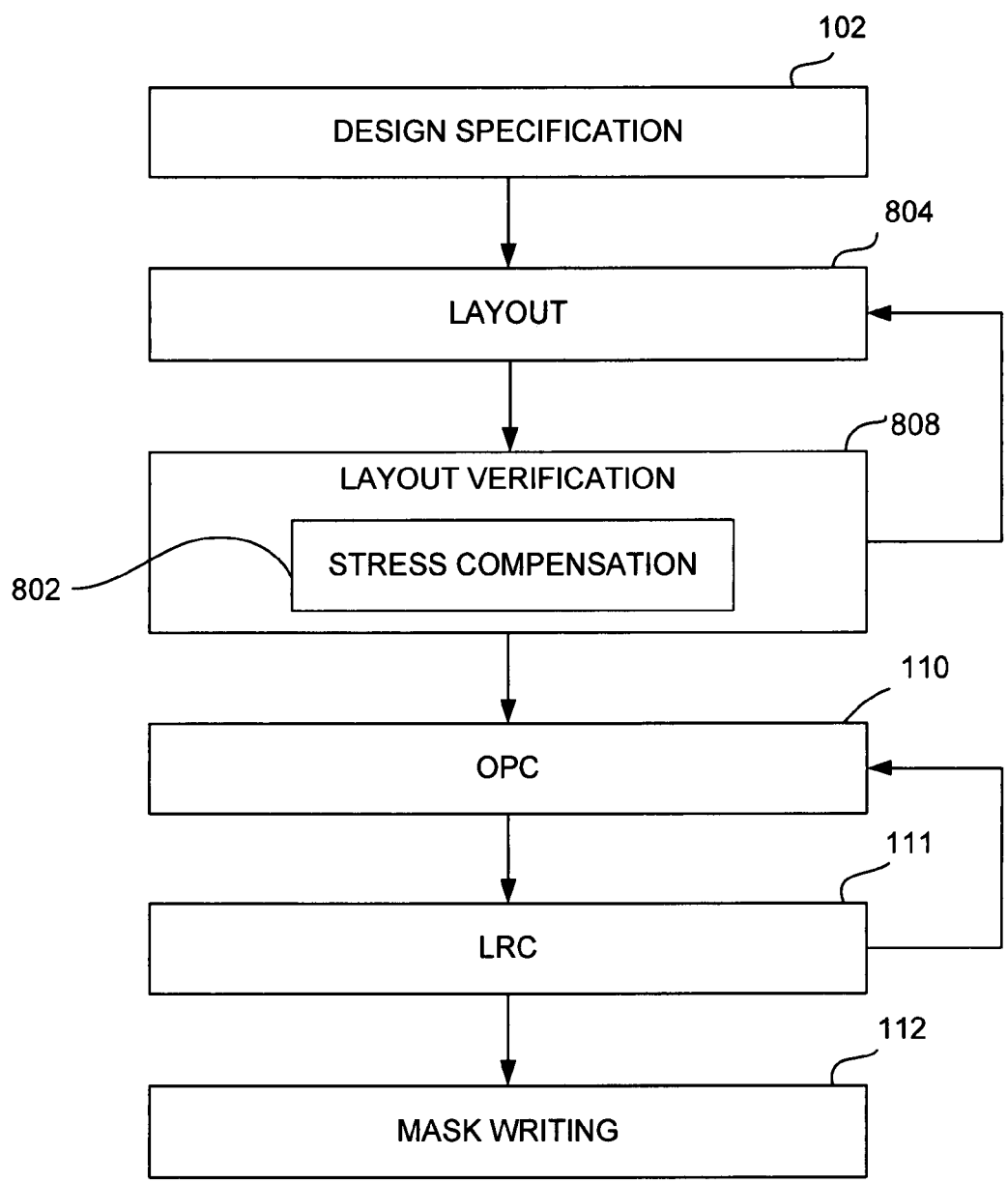
FIG. 8 is a block diagram depicting another exemplary embodiment of an IC design system in accordance with one or more aspects of the invention.

FIG. 8 is a block diagram depicting another exemplary embodiment of an IC design system 800 in accordance with one or more aspects of the invention. Elements in FIG. 8 that are the same or similar to those of FIG. 1 are designated with identical reference numbers. In the present embodiment, a stress compensation module 802 is included as part of the layout verification module 808. Therefore, the layout module 804 does not include a stress compensation module. The stress compensation module 802 operates similarly to the stress compensation module 116, with the exception that the stress compensation module 802 operates on the layout data during layout verification, rather than during layout by the layout module 804.

Figure 9:
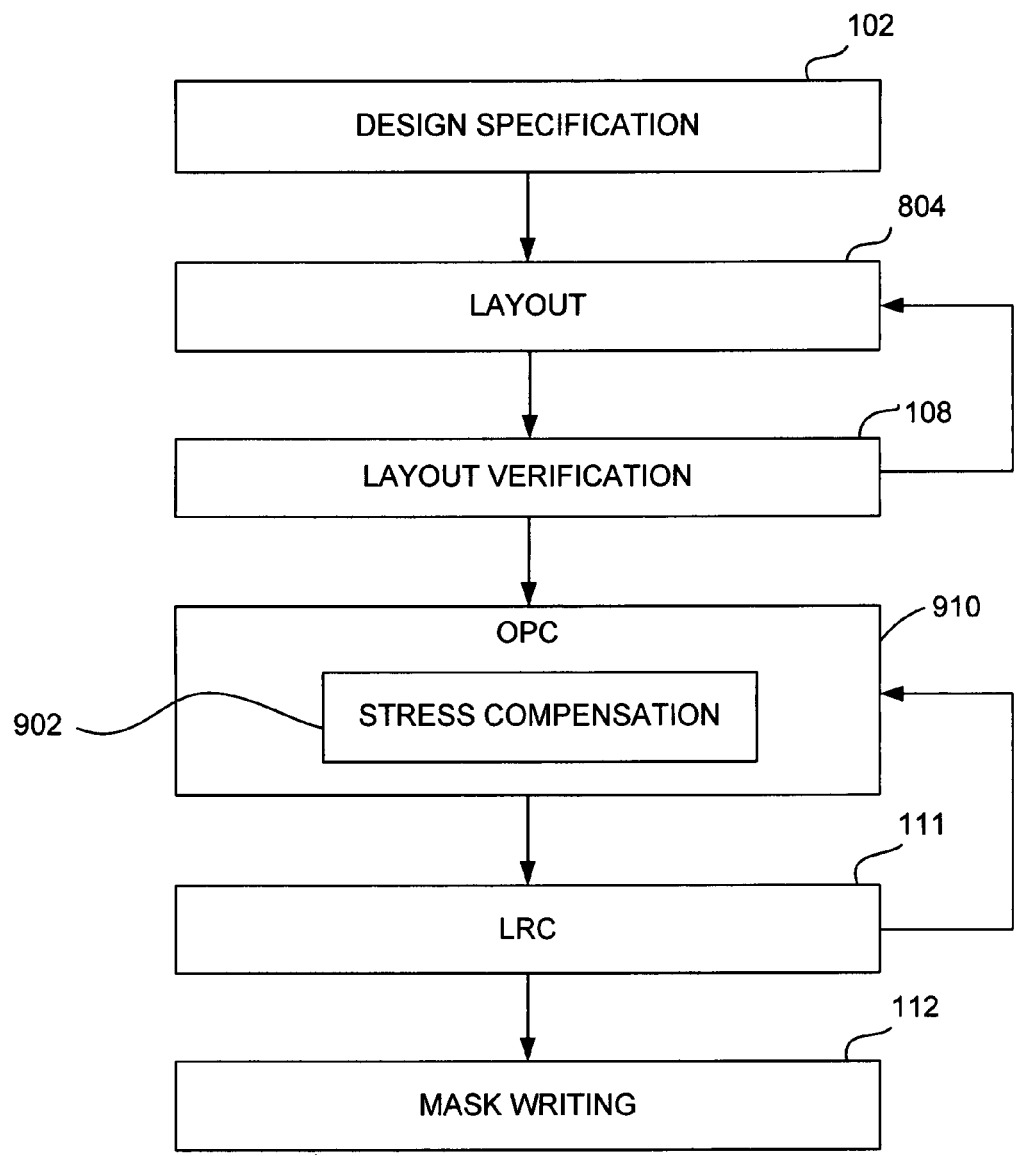
FIG. 9 is a block diagram depicting yet another exemplary embodiment of an IC design system in accordance with one or more aspects of the invention.

FIG. 9 is a block diagram depicting yet another exemplary embodiment of an IC design system 900 in accordance with one or more aspects of the invention. Elements in FIG. 11 that are the same or similar to those of FIGS. 1 and 8 are designated with identical reference numbers. In the present embodiment, a stress compensation module 902 is included as part of the OPC module 910. The typical OPC algorithm implemented by the OPC module 910 decreases OPC bias at the inner corners of line intersections, such as T-shaped and L-shaped junctions, to reduce the amount of corner rounding in order to maintain pattern fidelity. The stress compensation module 902 is configured to analyze one or more layers in the layout data to detect structures susceptible to damage from mechanical stress, such as line intersections as described above. For each identified structure, the stress compensation module 902 automatically provides a bias to increase the mechanical strength of the structure. For example, the stress compensation module 902 may intentionally increase the amount of corner rounding at a line intersection applied by the OPC algorithm. The increase in corner rounding has the effect of increasing the physical width of the structure at the junction when fabricated, which increases the mechanical strength of the structure and its resistance to cracking. The stress compensation module 902 can be similar to the stress compensation module 116, but is performed during OPC rather than prior to OPC.

Figure 10:
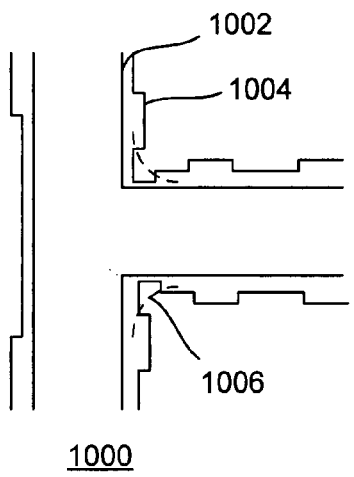
FIG. 10 is a block diagram depicting an exemplary layout of lines forming a T-shaped junction.
Figure 11:
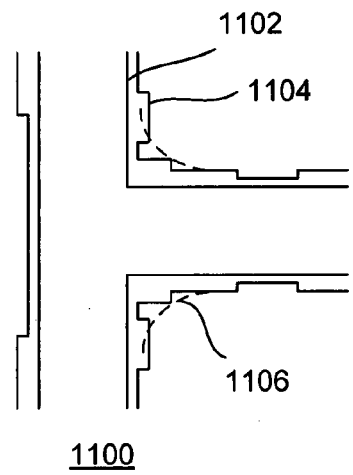
FIG. 11 is a block diagram depicting another exemplary layout of line forming a T-shaped junction.

FIG. 10 is a block diagram depicting an exemplary layout 1000 of lines 1002 forming a T-shaped junction. Outline 1004 shows the lines 1002 corrected for optical proximity effects using a typical OPC algorithm. At the corners of the junction, the OPC bias is decreased to reduce the amount of corner rounding. Contours 1006 show a simulated pattern shape at the corners after lithography. FIG. 11 is a block diagram depicting an exemplary layout 1100 of lines 1102 forming a T-shaped junction. Outline 1104 shows the lines 1102 corrected for optical proximity effects using an OPC algorithm as adjusted by the stress compensation module 902. At the corners of the junction, the OPC bias is increased to increase the amount of corner rounding. Contours 1106 show a simulated pattern shape at the corners after lithography. As shown, the width of the junction is increased with respect to that of FIG. 10.

Figure 12:
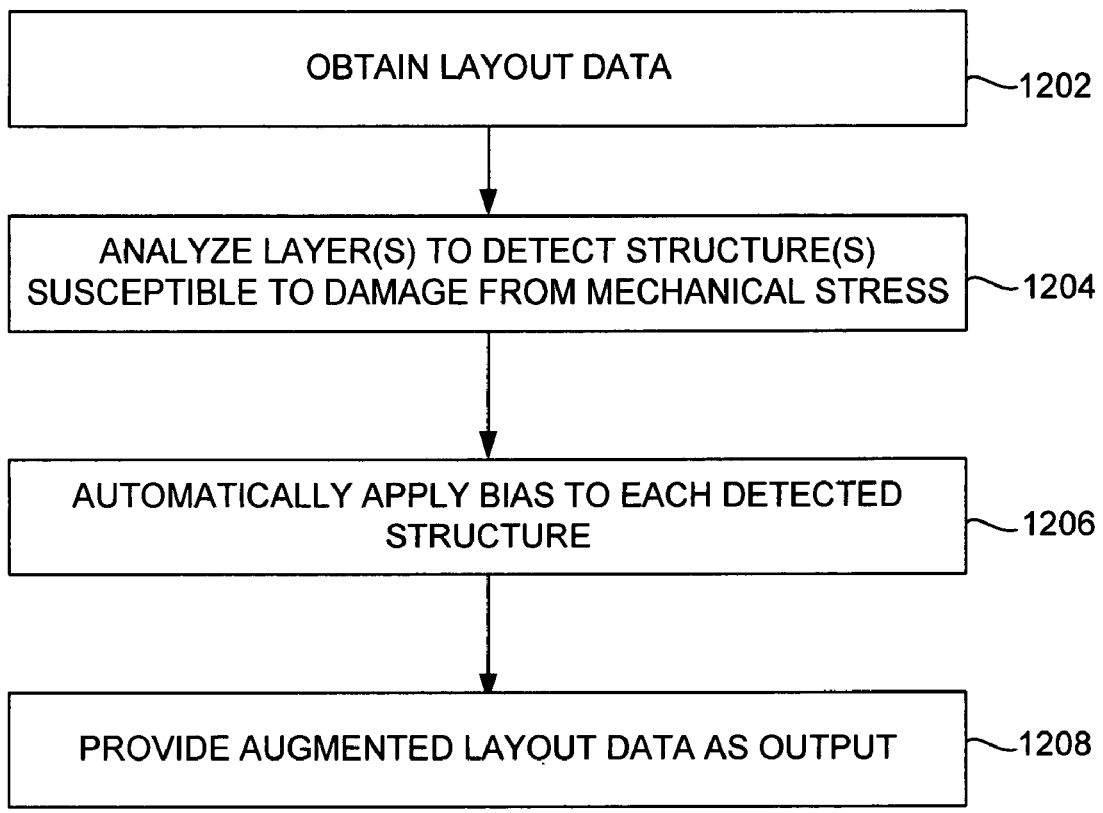
FIG. 12 is a flow diagram depicting an exemplary embodiment of a method for designing an IC in accordance with one or more aspects of the invention.

FIG. 12 is a flow diagram depicting an exemplary embodiment of a method 1200 for designing an IC in accordance with one or more aspects of the invention. The method 1200 begins at step 1202, where layout data is obtained that describes the layers of the IC. At step 1204, at least one of the layers is analyzed to detect at least one structure susceptible to damage from mechanical stress. At step 1206, a bias is applied to each such structure. The bias is applied to reduce the mechanical stress inside the structure when fabricated. At step 1208, augmented layout data is provided as output. The steps 1204 and 1206 may be performed during initial layout, during layout verification, or during OPC processing, for example.

Figure 13:
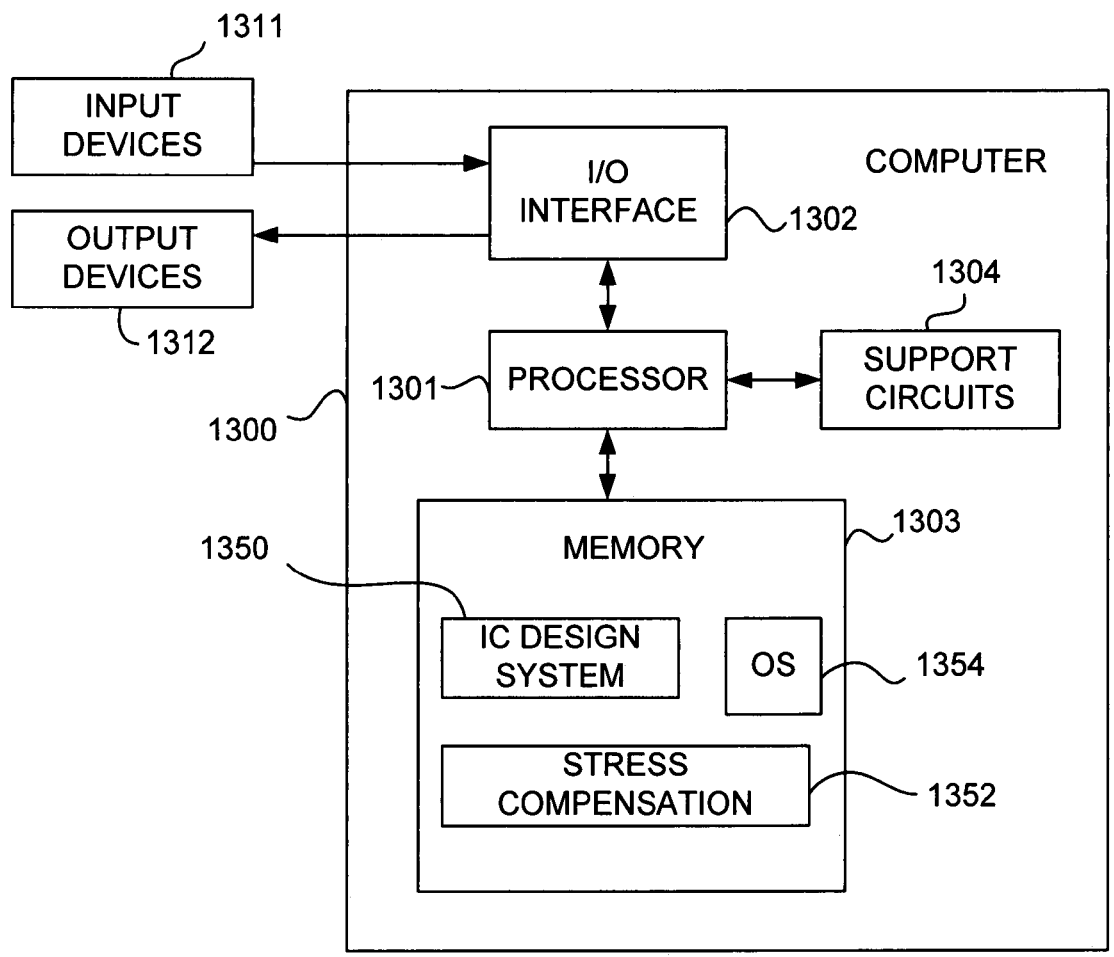
FIG. 13 is a block diagram depicting an exemplary embodiment of a computer suitable for implementing the processes described herein in accordance with one or more aspects of the invention.

FIG. 13 is a block diagram depicting an exemplary embodiment of a computer 1300 suitable for implementing the processes described herein in accordance with one or more aspects of the invention. The computer 1300 includes a processor 1301, a memory 1303, various support circuits 1304, and an I/O interface 1302. The processor 1301 may include one or more microprocessors known in the art. The support circuits 1304 for the processor 1301 may include conventional cache, power supplies, clock circuits, data registers, I/O interfaces, and the like. The I/O interface 1312 may be directly coupled to the memory 1303 or coupled through the processor 1301, as shown. The I/O interface 1302 is coupled to various input devices 1311 (e.g., keyboard, mouse, and the like) and output devices 1312 (e.g., display, printer, and the like).

The memory 1303 stores processor-executable instructions and/or data that may be executed by and/or used by the processor 1301. These processor-executable instructions may comprise hardware, firmware, software, and the like, or some combination thereof. Modules having processor-executable instructions that are stored in the memory 1303 include an IC design system 1350 and a stress compensation module 1352. The stress compensation module 1352 is configured to compensate IC layout data for mechanical stress effects, as described in the embodiments above. The computer 1300 may be programmed with an operating system (OS) 1354, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system 1354 may be disposed in the memory 1303. The memory 1303 may include one or more of the following: random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Programs of the program product define functions of embodiments and can be contained on a variety of signal-bearing media, which can include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A method of designing an integrated circuit, comprising:
    obtaining layout data describing layers of the integrated circuit;
    analyzing at least one of the layers as described in the layout data to detect at least one structure susceptible to damage from mechanical stress;
    automatically adding a bias to each of the at least one structure to reduce mechanical stress of the at least one structure as fabricated by:
        applying optical proximity correction to the layout data; and
        increasing corner rounding of the at least one structure during the optical proximity correction; and
    providing augmented layout data for the integrated circuit.

2. The method of claim 1, wherein the at least one layer includes a polysilicon layer.

3. A method of designing an integrated circuit, comprising:
    obtaining layout data describing layers of the integrated circuit;
    analyzing at least one of the layers as described in the layout data to detect at least one structure susceptible to damage from mechanical stress, wherein each of the at least one structure includes lines intersecting to produce at least one corner;
    automatically adding a bias to each of the at least one structure to reduce mechanical stress of the at least one structure as fabricated by adding at least one polygon at each of the at least one corner for each of the at least one structure prior to optical proximity correction; and
    providing augmented layout data for the integrated circuit.

4. The method of claim 3, further comprising:
    applying the optical proximity correction to the augmented layout data.

5. The method of claim 3, wherein the at least one layer includes a polysilicon layer.

6. A method of designing an integrated circuit, comprising:
    obtaining layout data describing layers of the integrated circuit;
    analyzing at least one of the layers as described in the layout data to detect at least one structure susceptible to damage from mechanical stress, wherein each of the at least one structure includes lines intersecting to produce at least one corner;
    automatically adding a bias to each of the at least one structure to reduce mechanical stress of the at least one structure as fabricated by:
        applying optical proximity correction to the layout data; and
        increasing rounding at each of the at least one corner for each of the at least one structure during the optical proximity correction; and
    providing augmented layout data for the integrated circuit.

7. The method of claim 6, wherein the at least one layer includes a polysilicon layer.

8. An apparatus for designing an integrated circuit, comprising:
    means for obtaining layout data describing layers of the integrated circuit;
    means for analyzing at least one of the layers as described in the layout data to detect at least one structure susceptible to damage from mechanical stress;
    means for automatically adding a bias to each of the at least one structure to reduce mechanical stress of the at least one structure as fabricated, including:
        means for applying optical proximity correction to the layout data; and
        means for increasing corner rounding of the at least one structure during the optical proximity correction; and
    means for providing augmented layout data for the integrated circuit.

9. The apparatus of claim 8, wherein each of the at least one structure includes lines intersecting to produce at least one corner, and wherein the means for increasing corner rounding comprises:
    means for increasing rounding at each of the at least one corner for each of the at least one structure during the optical proximity correction.

10. The apparatus of claim 8, wherein the at least one layer includes a polysilicon layer.

11. An apparatus for designing an integrated circuit, comprising:
    means for obtaining layout data describing layers of the integrated circuit;
    means for analyzing at least one of the layers as described in the layout data to detect at least one structure susceptible to damage from mechanical stress, wherein each of the at least one structure includes lines intersecting to produce at least one corner;
    means for automatically adding a bias to each of the at least one structure to reduce mechanical stress of the at least one structure as fabricated, the means for automatically adding including means for adding at least one polygon at each of the at least one corner for each of the at least one structure prior to optical proximity correction; and means for providing augmented layout data for the integrated circuit.

12. The apparatus of claim 11, further comprising:

means for applying the optical proximity correction to the augmented layout data.

13. The apparatus of claim 11, wherein the at least one layer includes a polysilicon layer.

14. A system for designing an integrated circuit, comprising:

a computer having a processor and a memory, the memory storing modules executable by the processor, the modules including:

a layout module configured to process a netlist to produce layout data describing layers of the integrated circuit;

a stress compensation module configured to analyze at least one of the layers as described in the layout data to detect at least one structure susceptible to damage from mechanical stress and to automatically add a bias to each of the at least one structure to reduce mechanical stress of the at least one structure as fabricated;

a layout verification module including the stress compensation module; and an optical proximity correction (OPC) module, wherein the stress compensation module is configured to add at least one polygon to the at least one structure prior to optical proximity correction by the OPC module.

15. The system of claim 14, wherein each of the at least one structure includes lines intersecting to produce at least one corner, and wherein the stress compensation module is configured to add the at least one polygon at each of the at least one corner for each of the at least one structure prior to the optical proximity correction.

16. The system of claim 14, wherein the at least one layer includes a polysilicon layer.

17. A system for designing an integrated circuit, comprising:

a computer having a processor and a memory, the memory storing modules executable by the processor, the modules including:

a layout module configured to process a netlist to produce layout data describing layers of the integrated circuit;

a stress compensation module configured to analyze at least one of the layers as described in the layout data to detect at least one structure susceptible to damage from mechanical stress and to automatically add a bias to each of the at least one structure to reduce mechanical stress of the at least one structure as fabricated;

a layout verification module; and an optical proximity correction (OPC) module including the stress compensation module, wherein the stress compensation module is configured to increase corner rounding of the at least one structure during the optical proximity correction by the OPC module.

18. The system of claim 17, wherein each of the at least one structure includes lines intersecting to produce at least one corner, and wherein the stress compensation module is configured to increase rounding at each of the at least one corner for each of the at least one structure during the optical proximity correction.

19. The system of claim 17, wherein the at least one layer includes a polysilicon layer.

* * * * *